United States Patent
Khullar et al.

(10) Patent No.: US 8,775,857 B2
(45) Date of Patent: Jul. 8, 2014

(54) SEQUENTIAL ON-CHIP CLOCK CONTROLLER WITH DYNAMIC BYPASS FOR MULTI-CLOCK DOMAIN TESTING

(75) Inventors: Shray Khullar, New Delhi (IN); Swapnil Bahl, New Delhi (IN)

(73) Assignee: STMicroelectronics International N.V., Amsterdam (NL)

( * ) Notice: Subject to any disclaimer, the term of this patent is extended or adjusted under 35 U.S.C. 154(b) by 287 days.

(21) Appl. No.: 13/152,013

(22) Filed: Jun. 2, 2011

(65) Prior Publication Data
US 2012/0166860 A1    Jun. 28, 2012

(30) Foreign Application Priority Data
Dec. 28, 2010   (IN) .............................. 3130/DEL/2010

(51) Int. Cl.
*G06F 1/08*  (2006.01)
*G06F 1/06*  (2006.01)
*G06F 11/22*  (2006.01)
*G01R 31/3185*  (2006.01)

(52) U.S. Cl.
CPC ... *G06F 1/06* (2013.01); *G06F 11/22* (2013.01); *G01R 31/318552* (2013.01); *G01R 31/318555* (2013.01)
USPC ........... 713/501; 713/500; 713/600; 714/731; 714/726; 714/738; 716/106; 716/136

(58) Field of Classification Search
CPC ... G06F 1/06; G06F 11/22; G01R 31/318552; G01R 31/315555
USPC .......... 713/500, 501, 600; 714/726, 731, 738; 716/106, 136
See application file for complete search history.

(56) References Cited

U.S. PATENT DOCUMENTS

| | | | | |
|---|---|---|---|---|
| 7,058,868 B2 * | 6/2006 | Guettaf | ..................... | 714/727 |
| 7,245,168 B2 * | 7/2007 | Rhee | ..................... | 327/298 |
| 2005/0225361 A1 * | 10/2005 | Rhee | ..................... | 327/99 |
| 2010/0198991 A1 * | 8/2010 | Yajima et al. | ..................... | 709/248 |

* cited by examiner

*Primary Examiner* — M Elamin
(74) *Attorney, Agent, or Firm* — Gardere Wynne Sewell LLP

(57) ABSTRACT

A controller includes a clock control unit configured to provide a first output to test circuitry and a bypass unit configured to provide a second output to a further controller. The controller is configured to cause the bypass unit to output the second output and to optionally cause the clock control unit to output the first output.

20 Claims, 6 Drawing Sheets

US 8,775,857 B2

SEQUENTIAL ON-CHIP CLOCK CONTROLLER WITH DYNAMIC BYPASS FOR MULTI-CLOCK DOMAIN TESTING

PRIORITY CLAIM

This application claims priority from Indian Application for Patent No. 3130/DEL/2010 filed Dec. 28, 2010, the disclosure of which is hereby incorporated by reference.

TECHNICAL FIELD

The present invention relates to clock controllers and in particular but not exclusively to automatic test pattern generation.

BACKGROUND

Automatic test pattern generation (ATPG) is used to identify test sequences which can be applied to circuits in order to determine whether they behave correctly. In ATPG, test patterns are mathematically generated and used to test semiconductor devices after manufacture. Test patterns may also be used to assist in the determination of the causes of defects.

The power consumption of semiconductor chips while their circuits are in testing modes, such as those generated using automatic test pattern generation, may be much larger than their power consumption during functioning modes. The increased power requirements may be in the order of three to thirty times greater when in testing modes. This difference in power requirements may result in false failures during test, damage to the circuitry occurring during testing or future reliability problems due to high junction temperatures.

SUMMARY

There is provided according to a first embodiment a controller comprising: a clock control unit configured to provide a first output to test circuitry; and a bypass unit configured to provide a second output, said second output being provided to a further controller, wherein said controller is configured to cause said bypass unit to output said second output and to optionally cause said clock control unit to output said first output.

At least one of said clock control unit and said bypass unit may be respectively controlled to in response to received information comprising at least one of: scan enable information, clock controller enable information and sequential selection information The bypass unit may receive sequential selection information from at least one of said clock control unit, a further controller or a control unit.

The bypass unit may be configured to provide said second output if said bypass unit has received sequential selection information from said clock control unit or the received information indicates that said first output is not required.

The controller may further comprise a first stability unit configured to receive sequential selection information at an operating frequency of said controller. The first stability unit may comprise a shift register configured to store said sequential selection information for a plurality of cycles of the operating frequency of said controller.

The controller may comprise a second stability unit configured to receive scan enable information at an operating frequency of said controller.

The controller may comprise a clock gating unit configured to combine the outputs of said first stability unit and said second stability unit at said operating frequency of said controller, said clock gating unit may be configured to provide an input to said clock control unit.

The first output may be a capture clock output to at least one logic block. The second output may be sequential selection information for said further controller. The second output may be provided at an operating frequency of said controller.

A chain of N controllers may be provided, wherein N may be greater than or equal to two and wherein each of said further and subsequent controllers receives, as an input, said second output from said bypass unit of a preceding controller.

The sequential selection information received by the clock control unit of a first of said controllers may be said scan enable signal and the sequential selection information received by further and subsequent controllers may be said second output of said bypass unit of the preceding controller.

When the clock control unit of at least one of said further and subsequent controllers is not required, said bypass unit of said at least one not required controller may receive sequential selection information from a previous controller.

The sequential selection information may be said second output second output of said bypass unit of said previous controller.

A circuit testing unit may comprise, a control unit, at least one oscillator, the chain of N controllers and test circuitry associated with each of said N controllers. The circuit testing unit may be configured to receive at least one automatic test pattern generation sequence. The circuit testing unit may be an on chip circuit testing unit.

BRIEF DESCRIPTION OF THE DRAWINGS

Embodiments will now be described, by way of example only, with reference to the Figures, in which.

DETAILED DESCRIPTION OF THE DRAWINGS

Figure 1:
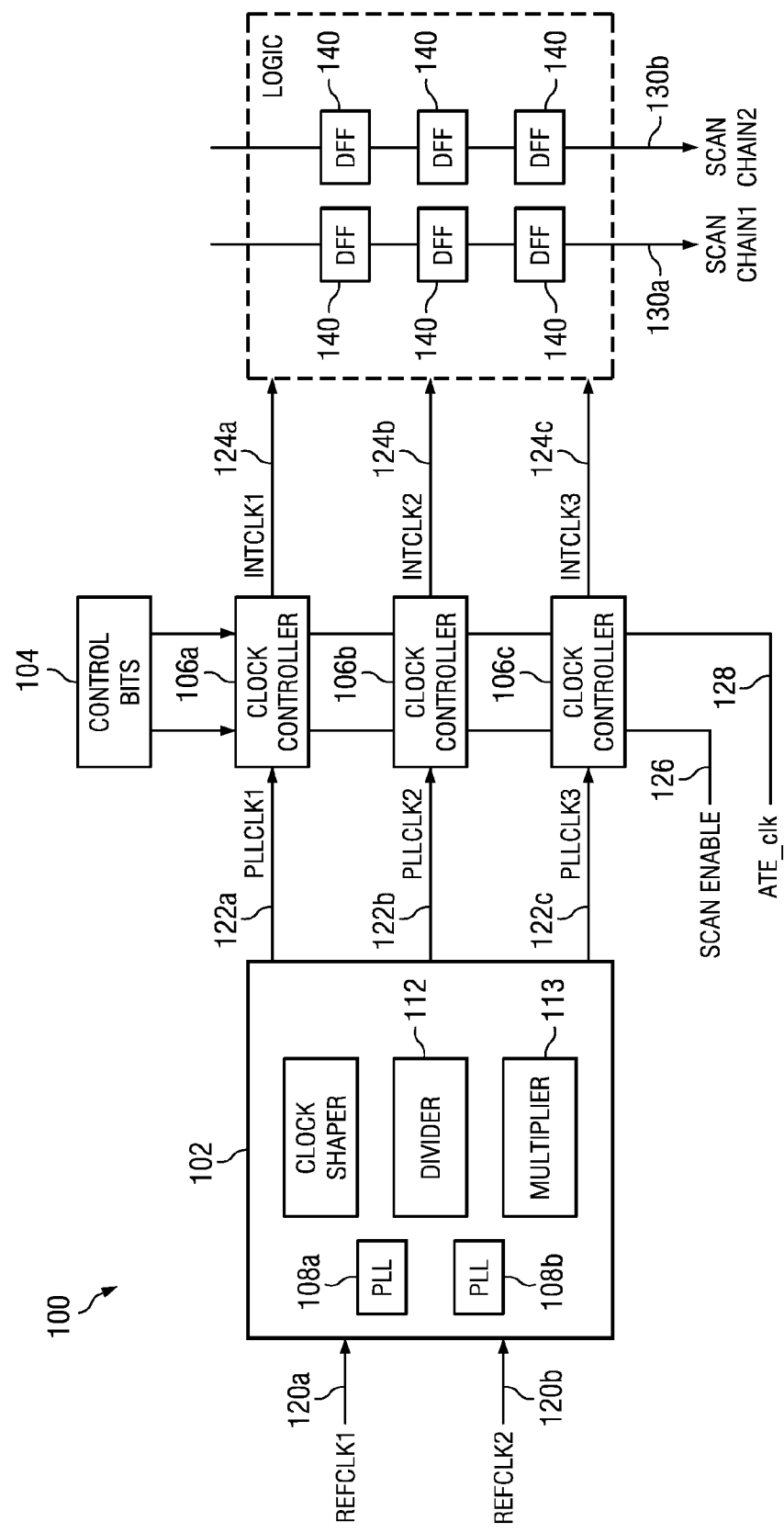
FIG. 1 shows an on chip testing control unit.

FIG. 1 shows an on chip testing control unit 100. Reference clocks 120a, 120b are input into a phase locked loop clock signal generator 102. Each phase locked loop clock signal generator 102 comprises phase locked loop units 108a, 108b respectively associated with the reference clocks 120a, 120b and a clock shaper 110, a divider 112 and a multiplier 113. The generator 102 outputs three phase locked loop clocks 122a, 122b, 122c each linked to a respective clock controller 106a, 106b, 106c. The clock controllers 106a, 106b, 106c are controlled using control bits output from control unit 104, a scan enable signal 126 and an automatic testing equipment (ATE_clk) clock 128. Each of the clock controllers outputs a respective shift/capture clock signal 124a, 124b, 124c to scan chains 130a, 130b of logic blocks 140.

ATPG scan methods may comprise different modes. In a shifting mode, indicated in some embodiments by the scan enable signal 126 being asserted or high, all of the clock controllers are pulsed using the same ATE clock signal 128. In a capture mode, indicated in some embodiments by the scan enable signal 126 not being asserted or being low, each of the clock controllers is pulsed by an individual clock cycle and defects within the logic blocks 140 may be identified.

Each of the clock controllers 106a, 106b, 106c may be clocked using a different shift/capture clock signal 124a to 124c. In some embodiments, the clock signal may be a phase locked loop clock signal, an oscillator signal or any other clock signal. In some embodiments, the clock signals may differ in frequency, waveform shape, phase or pulse duration.

Figure 2:
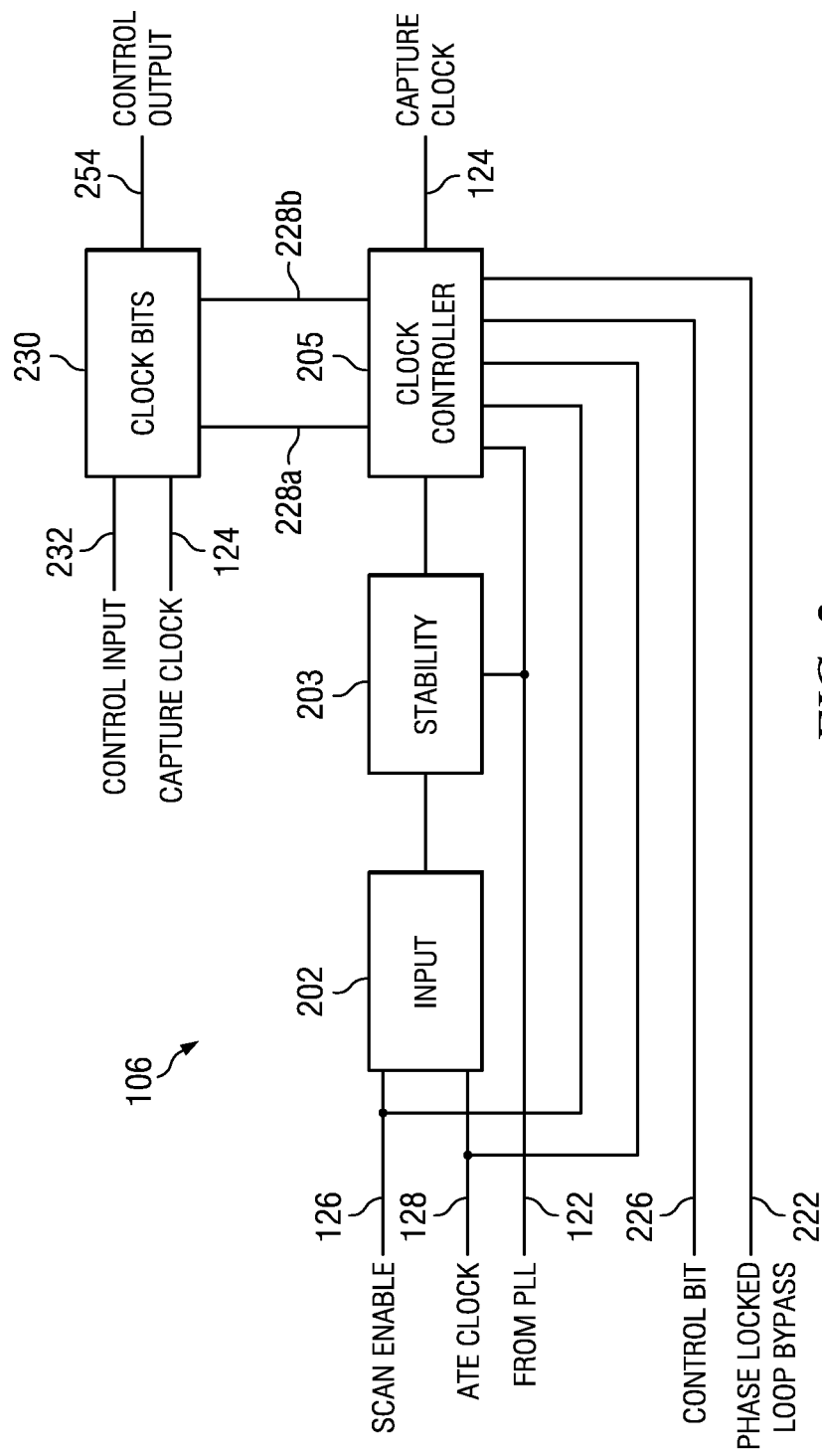
FIG. 2 shows a block diagram of a clock controller unit.

FIG. 2 shows a block diagram of an example of a clock controller unit 106. An input block 202 receives the scan enable signal 126 and the ATE clock 128 as inputs. The input block 202 provides an output which is received as an input by a stability unit 203. This output is the scan enable signal clocked at the ATE clock rate. The stability unit 203 also receives the phase locked loop clock signal 122 as an input. The stability unit provides an output which is received as an input by clock controller 205. This output is the scan enable signal now clocked at the PLL clock signal rate. The clock controller 205 also receives the phase locked loop signal 122, the scan enable signal 126, the ATE clock signal 128, control signal 226 and clock bit signals 228a, 228b as inputs. The clock controller 205 provides the scan shift/capture clock 124 as an output. The clock bits unit 230 receives a control signal 232 provided by the control unit 104 and the shift/capture clock 124 provided by the clock controller 205 as inputs. The clock bits unit 230 provides clock bit signals 228a, 228b to the clock controller 205 and a control output 254 to the control unit 104 as outputs.

Figure 3:
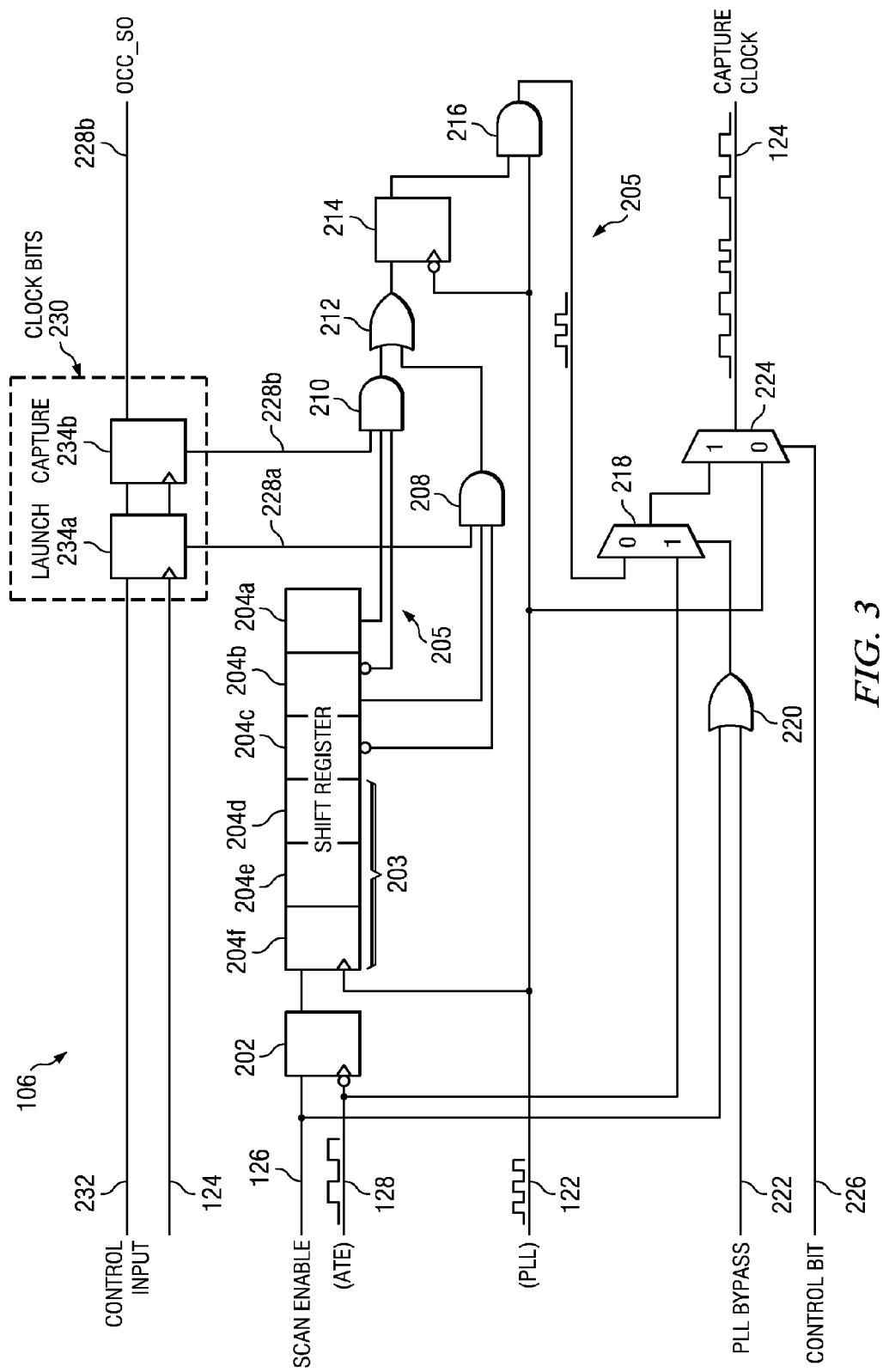
FIG. 3 shows a clock controller unit schematically.

An example of the clock controller unit 106 is shown in more detail in FIG. 3. In some embodiments, the input block 202 comprises a negative edge triggered flip-flop 202 which receives the Scan Enable signal 126 and the ATE clock signal 128 as inputs. The ATE clock signal 128 is used to trigger the flip-flop 202 to store the Scan Enable signal 126. The output provided by flip-flop 202 is received as an input by a block of shift registers 204f, 204e, 204d, 204c, 204b, 204a, where register 204f is the first register, located the closest to the flip-flop 202, and register 204a is the last register, located the furthest from the flip-flop 202. The first three registers 204f, 204e, 204d form the stability unit 203. The last three registers 204c, 204b, 204a form part of the clock controller 205.

The number of shift registers in the stability unit 203 may vary depending on the design implementation. The number of shift registers in the clock controller 205 may vary depending on the number of capture cycles required.

The shift registers 204f-204a are clocked by a positive edge of the phase lock loop clock signal 122. The inverted output of register 204c, the non inverted output of register 204b and the clock bit signal 228a are provided as inputs to a first AND gate 208. The non inverted output of the register 204a, the inverted output of the register 204b and the clock bit signal 228b are provided as inputs to a second AND gate 210.

The outputs provided by the two AND gates 208 and 210 are received as inputs to an OR gate 212. The output of the OR gate 212 is received as an input into a further flip-flop 214. The flip-flop 214 is clocked using the phase locked loop clock signal 122. The output provided by the flip-flop 214 and the phase locked loop signal 122 are received as inputs to an AND gate 216.

The outputs provided by the AND gate 216 and the ATE clock signal 128 are received as inputs into a first multiplexer 218. The first multiplexer 218 is controlled by an input received from an OR gate 220. The OR gate 220 receives the scan enable signal 126 and a phase locked loop bypass signal 222 as inputs. The output provided by the multiplexer 218 and the phase locked loop clock signal 122 are received as inputs to a second multiplexer 224. The second multiplexer 224 is controlled by a clock control test mode signal (control bit) 226 which is received from the control bits unit 104. The second multiplexer 224 generates the shift/capture clock signal 124 which is output from the clock controller 106 to the chains of logic blocks 140 and the clock bit unit 230.

Clock bit unit 230 comprises a first flip-flop 234a that receives a clock control signal 232 from the control unit 104 and the shift/capture clock signal 124 as inputs. The first flip-flop 234a is rising edge triggered by the shift/capture clock 124. The flip-flop 234a provides as an output clock bit signal 228a which is received as an input by a second flip-flop 234b which is within the clock bit unit and to the AND gate 208. The second flip-flop 234b also receives the shift/capture clock 124 as an input. The second flip-flop is rising edge triggered by the shift/capture clock 124 and provides as an output clock bit signal 228b to the AND gate 210 and to the control unit 104. The clock bit unit 230 may be programmed during scan shift mode by the ATPG. However, by virtue of the design, the clock bit unit 230 may retain these programmed values during scan capture mode.

If an ATPG pattern requires a particular clock controller 106 to pulse its associated logic, this may be indicated to the clock controller via the clock bits unit 230.

In some embodiments, the clock bits 230 indicate that the clock controller is to pulse its associated logic 140 by outputting a high logic signal from the clock bit unit flip-flops 234a, 234b. When the testing is in a shifting mode, the scan enable signal, selects the ATE clock signal at the first multiplexer 218 and thus the control clock is the ATE clock signal.

The ATE clock signal may also be used to clock the Scan Enable signal in the input flip-flop. The phase locked loop clock signal then clocks its signal into the shift registers 204f to 204a. When the scan enable signal falls to a low logic level, to indicate the capture mode, the first multiplexer 218 outputs the signal received from the AND gate 216. During the capture mode, the low level of the scan enable signal is clocked through the input and shift registers and creates a bubble of three consecutive logic 0 values which pass through the shift registers and logic and generate the fast capture cycle pulses.

Referring again to FIG. 1, each of the clock controllers 106a, 106b and 106c operates asynchronously with respect to the other clock controllers 106a, 106b, 106c because they are each clocked by different phase lock loop clock signal 122a, 122b, 122c respectively. This may result in the shift/capture clocks 124a, 124b, 124c not being synchronized with respect to one another when in capture mode.

Unsynchronized shift/capture clocks 122a, 122b, 122c may result in an inability to generate accurate power estimations for designs requiring more than one clock controller as the predicted switching activity generated by simulations of the circuitry may be inaccurate. This is because the occurrence of pulses in each of the clock controllers 106a, 106b, 106c cannot be predicted and thus two or more clock controllers may pulse at the same time generating a spike in the peak and average power requirements of the circuitry. Furthermore power consumption may increase due to increased system on chip complexity and increased operating and clock frequencies.

Figure 4:
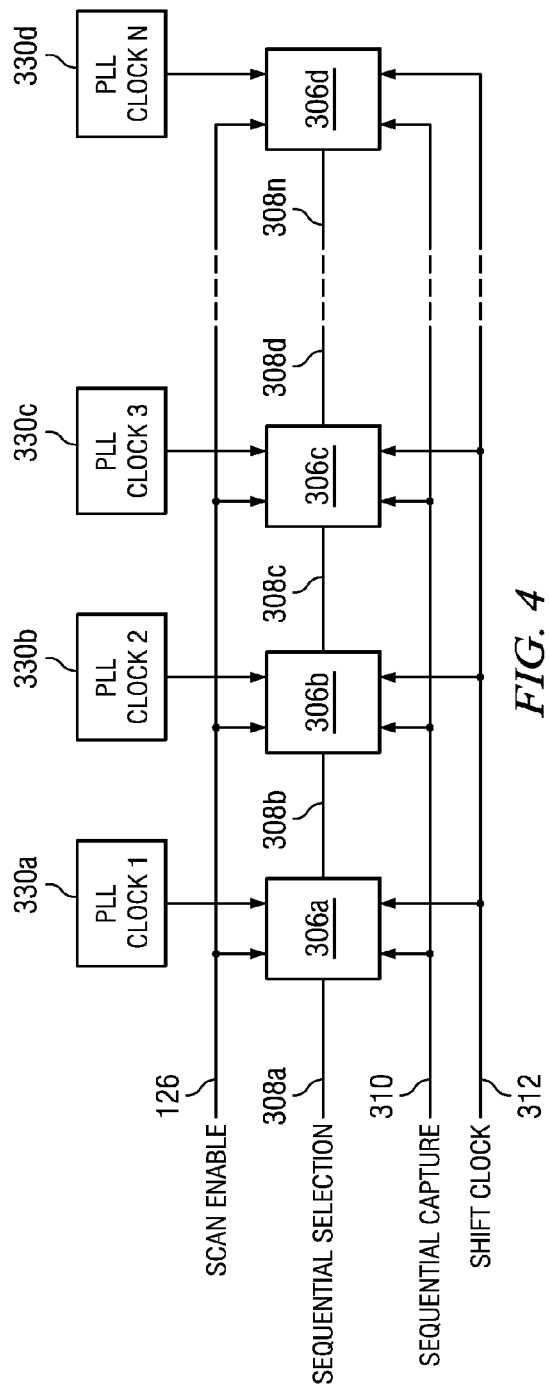
FIG. 4 shows a set of sequential on chip clock controllers.

Unreliable power estimation may result in the power required for switching activity exceeding the available power for the circuitry and can result in apparently implementable designs failing when implemented in silicon due to their excessive power requirements during test mode. Excessive peak power may also result in an unacceptable IR-drop across the chip FIG. 4 shows a chain of sequential clock controllers 306a, 306b, 306c . . . 306n as used in some embodiments. Each of the sequential clock controllers 306a, 306b, 306c . . . 306n receives as inputs the scan enable 126 signal, a sequential capture signal 310 and shift clock 312. Each of the sequential clock controllers 306a, 306b, 306c . . . 306n is connected to a separate clock source. In some embodiments, the clock sources are independent phase locked loop clock signals. The other inputs and outputs connected to the sequential clock controllers 306 have been omitted for clarity.

In some embodiments the first sequential clock controller 306a, receives as an input a sequential selection signal 308a from control unit 10. The first sequential clock controller 306a, provides as an output a sequential selection signal 308b received as an input at a second sequential clock controller 306b. The second sequential clock controller 306b provides as an output a sequential selection signal 308c received as an input at a third sequential clock controller 306c and so on such that each sequential clock controller 306a to 306n receives a sequential selection signal 308a to 308n from the previous sequential clock controller.

In some embodiments each sequential clock controller 306 in the chain is operational once the previous sequential clock controller 306 has completed its functions. This means that only one of the clock controllers is active at any time during the scan capture period. The scan enable signal may be used as a handshake signal transferred between the sequential clock controllers. Thus the capture power requirement at any one time is that of one sequential clock controller 306 and its associated logic blocks 140. This means that the maximum peak and average power requirements may be more easily estimated and may be reduced. Alternatively more than one, but not all of the clock controllers may be active at the same time during the scan capture period.

Figure 5:
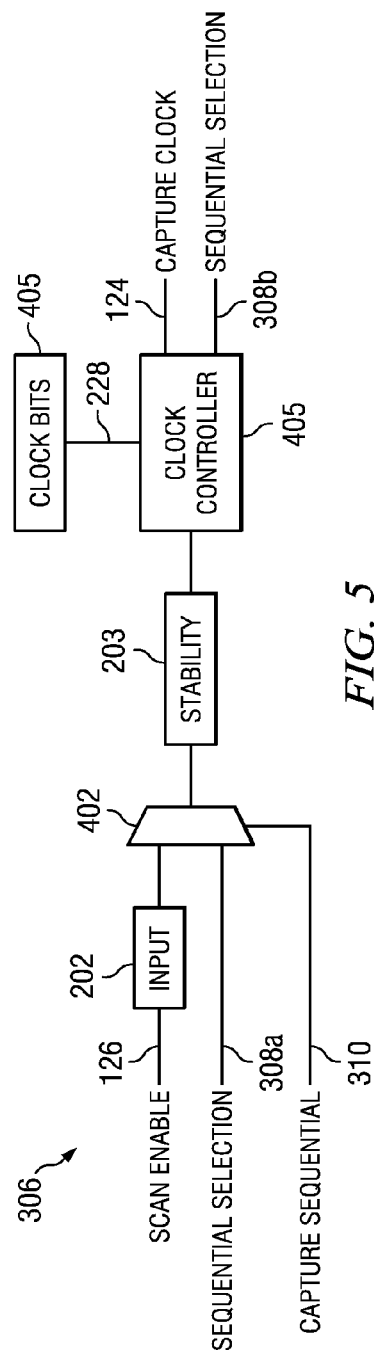
FIG. 5 shows a block diagram of a sequential on chip clock controller.

FIG. 5 shows an example block diagram of an embodiment of a sequential clock controller 306. The sequential clock controller 306 comprises an input 202 which receives the scan enable signal 126 as an input and provides an output which is received as an input by a multiplexer 402. The multiplexer receives the sequential selection signal 308a as a second input and is controlled by the capture sequential signal 310 which is received as a third input. The multiplexer 402 provides an output which is received as an input by the stability unit 203. The stability unit 203 provides an output which is received as an input by the clock controller unit 405. The clock controller unit 405 further receives inputs 228 provided by the outputs from the clock bits unit 230. The clock controller unit 405 is configured to produce as an output the sequential selection signal 308b which is received as an input at a next sequential clock controller 306b in the clock controller chain.

In some embodiments, the circuitry used for the input unit 202, the stability unit 203, the clock bits unit 230 and the clock controller 405 may be the same as those described for the respective elements of the clock controller 105. The sequential signal selection 308b may be provided by the output of the last register 204a in the clock controller 105. Thus when the scan enable signal goes low, a bubble of low logic values is generated in the first sequential clock controller 306a and propagates through the shift registers 204f to 204a of the first sequential clock controller 306a as discussed above. The bubble is then passed onto the second sequential clock controller 306b where it propagates through the shift registers of the second sequential clock controller 306b and is passed onto the third sequential clock controller 306c and so on until it has propagated through to the last sequential clock controller in the chain 306n.

In some embodiments, test patterns generated by the ATPG may not test all of the logic blocks 140. This means that not all clock controllers 306a to 306n may need to generate clocks during a specific scan capture period. For example, a circuit may have 400 clock controllers but only 10 of the clock controllers may be required in a given test pattern. In some embodiments all the sequential clock controllers 306a to 306n are all part of the sequential chain in every test pattern. This may mean that some of the controllers would needlessly add to the scan test time. In complex chips with many clock controllers 306, this may generate capture delays and may result in increases to the required scan test times. This delay may result in some of the clock controllers which are required in a particular test pattern but located towards the end of the sequential chain not having been pulsed before the end of the capture mode period. For example, in a particular test pattern only clock controller 306a and 306n may be required to generate clock cycles during capture. However, the handshake signal may reach the clock controller 306n after having to pass through all the clock controllers 306b to 306m. This time delay is redundant and may produce very long test times in embodiments comprising a large number of clock controllers in the design.

Using dynamic bypass sequential clock control may enable the bypassing of clock controllers 306a to 306n within the sequential chain which may not need to be pulsed in a specific capture mode. This may enable the capture mode to be reduced by ensuring that that only required clock controllers are functioning and thus ensuring that the generated automatic test pattern is not modified.

Figure 6:
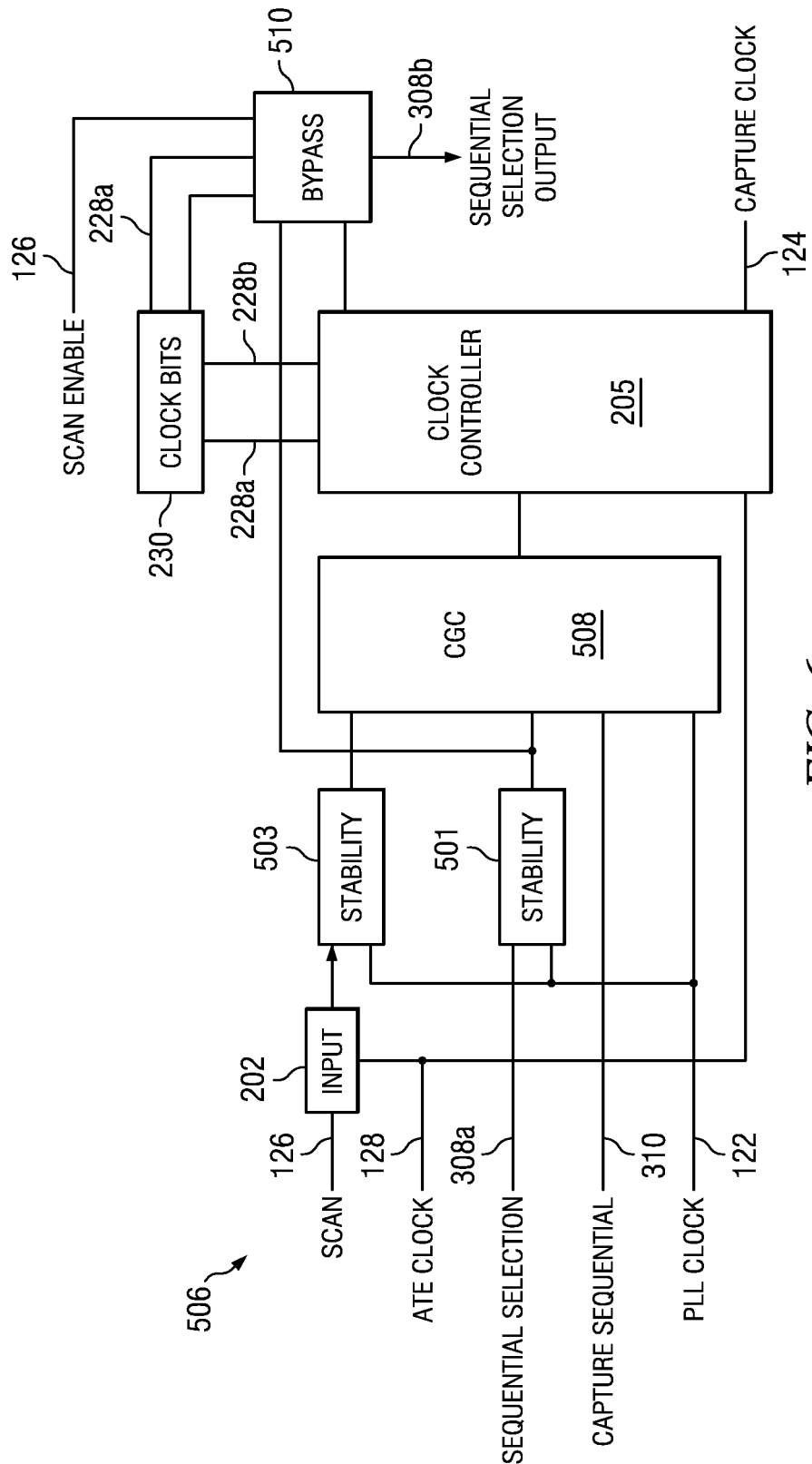
FIG. 6 shows a block diagram of a dynamic bypass sequential on chip clock controller.

FIG. 6 shows a block diagram of an embodiment of sequential clock controller 506 which uses dynamic bypass.

The dynamic bypass sequential clock controller 506 comprises the input unit 202 which receives as an input the scan enable signal 126 and the ATE clock signal 128. The output provided by input unit 202 is received as an input at a first stability unit 503. The first stability unit 503 further receives the phase locked loop clock signal 122 as an input. A second stability unit 501 receives the sequential selection signal as a first input and the phase locked loop signal 122 as a second input. The outputs provided by the first stability unit 503 and second stability unit 501 are received with the capture sequential signal 310 and the phase lock looped clock signal 122 as inputs into a clock gating circuit (CGC) 508.

The output provided by the clock gating circuit 508 is received as an input by the clock controller 205 which functions as described above. The outputs 228a, 228b provided by the clock bits unit 230, the scan enable signal 126, the output of the second stability unit 501 and the scan enable signal output from the clock controller 205 are received as an input to the clock control bypass unit 510. The clock control bypass unit 510 provides as an output the sequential selection output signal which may be received as an input by a subsequent dynamic bypass sequential clock controller 506 in the chain.

In some embodiments, the clock bits unit indicates to the bypass unit 510 that the logic associated with the clock controller does not need to be pulsed in the current pattern. Thus when the bypass unit 510 receives the sequential selection signal handshake of the previous clock controller, from the stability unit 501, it may be passed onto the next dynamic bypass sequential clock controller without having to wait for the bubble to propagate through the shift registers of clock controller 205. This means that the use of the bypass unit may half the number of cycles required for the propagation of the handshake bubble through an unwanted clock controller from 6 cycles to 3 cycles. In embodiments with a large numbers of clock controllers, this may significantly reduce the time required for a successful capture mode.

Each dynamic bypass sequential clock controller 506 may be configured to determine whether it needs to be pulsed.

Each dynamic bypass sequential clock controller 506 may be configured to indicate to a following dynamic bypass sequential clock controller 506 that it may function.

Figure 7:
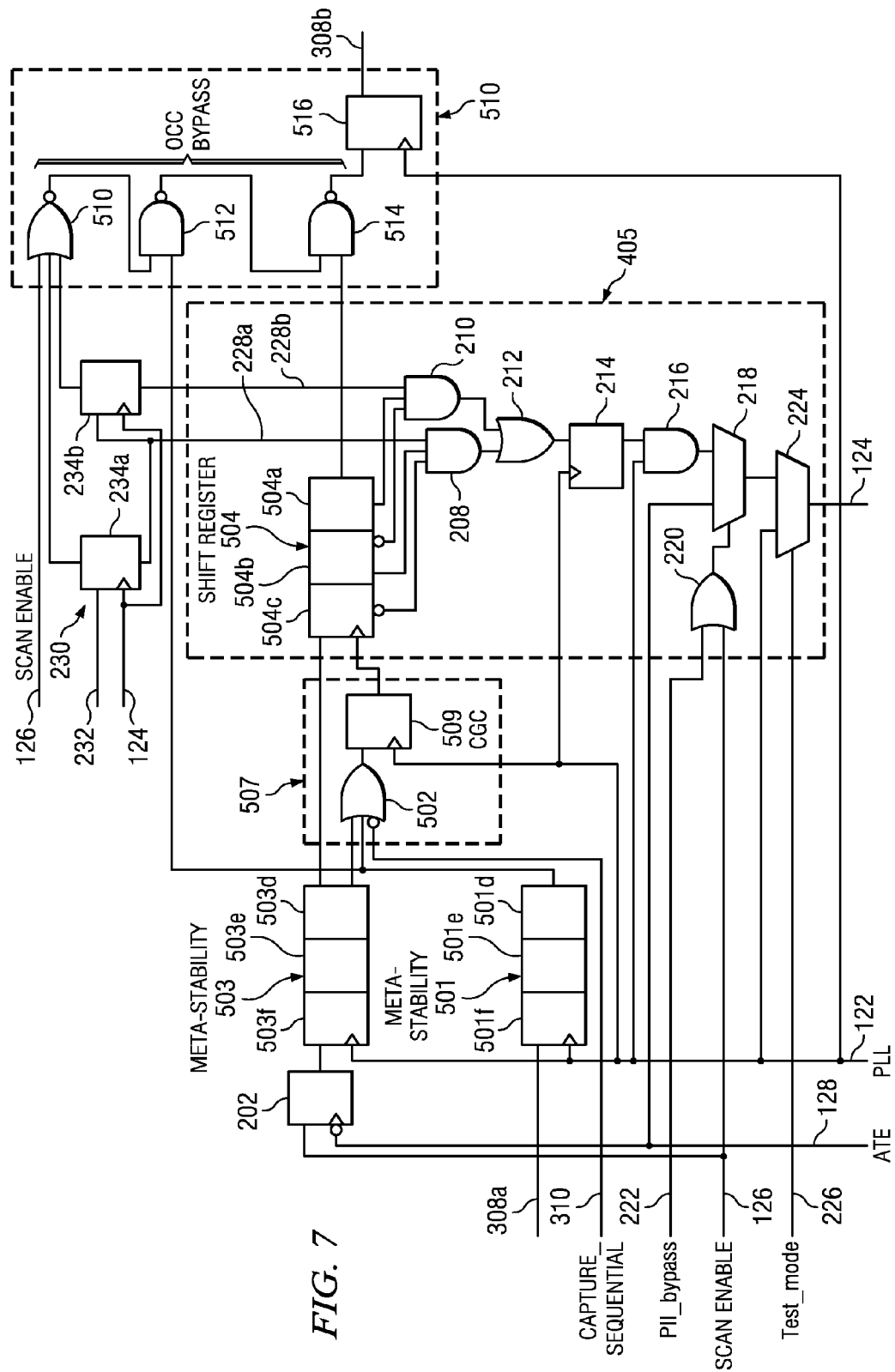
FIG. 7 shows of a dynamic bypass sequential clock controller schematically.

FIG. 7 shows an example schematic of a dynamic bypass sequential clock controller 506. In some embodiments, the input block 202 is formed from a negative edge triggered flip-flop 202 which receives the Scan Enable signal 126 and the ATE clock signal 128 as inputs. The ATE clock signal 128 is used to trigger the flip-flop 202 to store the Scan Enable signal 126.

The stability units 503, 501 each comprise a shift register 503, 501 comprising three flip flops 503f, 503e, 503d and 501f, 501e, 501d respectively which are positive edge triggered. Stability unit 503 receives as an input the output provided by flip-flop 202 and is clocked by the rising edge of the phase locked loop clock signal 122. Stability unit 501 receives as an input the sequential selection signal 308a and is clocked by the rising edge of the phase locked loop clock signal 122. The stability units ensure that signals are received by the clock control unit synchronously. The shift registers in the stability units may be of any size and may not be the same size as one another.

The outputs provided by the stability units and the inverted capture sequential signal 310 are received as inputs at a first AND gate 502. The output provided by the first AND gate 502 is received as an input into a clock generation controller (CGC) flip flop 509. The flip flop 509 is clocked by the rising edge of the phase locked loop clock signal 122. The output of the flip flop 509 is used to clock the clock controller shift register 504. The shift register of the clock controller may be of any size and may be of a different size to those of the stability units.

The shift registers 504c, 504b, 504a are clocked by a positive edge of the phase lock loop clock signal 122. The inverted output of register 504c, the non inverted output of register 504b and the clock bit signal 228a are provided as inputs to a first AND gate 208. The non inverted output of register 504a, the inverted output of register 504b and the clock bit signal 228b are provided as inputs to a second AND gate 210.

The outputs provided by the two AND gates 208 and 210 are received as inputs to an OR gate 212. The output of the OR gate 212 is received as an input into a further flip-flop 214. The flip-flop 214 is clocked using the phase locked loop clock signal 122. The output provided by the flip-flop 214 and the phase locked loop signal 122 are received as inputs to an AND gate 216.

The output provided by the AND gate 216 and the ATE clock signal 128 are received as inputs into a first multiplexer 218. The first multiplexer 218 is controlled by an input received from an OR gate 220. The OR gate 220 receives the scan enable signal 126 and a phase locked loop bypass signal 222 as inputs. The output provided by the first multiplexer 218 and the phase locked loop clock signal 122 are received as inputs to a second multiplexer 224. The second multiplexer 224 is controlled by a clock control test mode signal 226 which is received from the control bits unit 104. The second multiplexer 224 generates the shift/capture clock signal 124 which is output from the dynamic bypass sequential clock controller 506 to the chains of logic blocks 140 and the clock bit unit 230.

Clock bit unit 230 comprises a first flip-flop 234a that receives a clock control signal 232 from the control unit 104 and the shift/capture clock signal 124 as inputs. The first flip-flop 234a is rising edge triggered by the shift/capture clock 124. The flip-flop 234a provides as an output clock bit signal 228a which is received as an input by a second flip-flop 234b which is within the clock bit unit and by the AND gate 208. The second flip-flop 234b is also receives the shift/capture clock 124 as an input. The second flip-flop is rising edge triggered by the shift/capture clock 124 and provides as an output clock bit signal 228b to the AND gate 210 and to the control unit 104.

Clock control bypass unit 510, comprises a NOR gate 510 which receives as inputs the outputs of the two chain bits flip flops and the scan enable signal. The output provided by the first NOR gate 510 and the output of the shift-register 501 are received as inputs by a first NAND gate 512. The output provided by the first NAND gate 512 and the output provided by the shift register 504a are received as inputs by a second NAND gate 514. The output provided by second NAND gate 514 is received as an input into a flip flop 516. The flip flop 516 is clocked by the positive edge of the phase locked loop clock signal 122. The flip flop 516 provides as an output the sequential selection signal 308b which may be received as an input by a subsequent dynamic bypass sequential clock controller 506 in the chain. The flip-flop 516 ensures that the sequential selection signal is output synchronously.

The above described circuitry for the parts of the clock controllers is an example of one embodiment. Other embodiments may use different circuit designs, implementations or layouts.

In some embodiments signals may be input and output from the clock controllers using flip flops and may provide glitch free implementation across clock domains.

In some embodiments, some of the clock controllers and their associated logic blocks may be determined to have significantly lower power requirements than others, enabling two or more of the clock controllers to be scanned at the same time during the scanning chain.

Some embodiments may provide optimized capture duration as the dynamic bypass on chip controllers which are not active in a scan pattern are bypassed.

Some embodiments enable more switching activity to occur in each of the logic block tests as the available power may increase due to the lack of shift/capture clock overlap during the capture mode.

In some embodiments whether a clock controller is to be bypassed may be determined away from the clock controller.

In some embodiments the power consumption of individual circuits may be minimized.

In some embodiments the clock controllers may be on chip clock controllers, IC clock controllers or off chip clock controllers.

In some embodiments the logic blocks 140 may comprise digital circuitry, analogue circuitry, flip-flops, synchronous logic, asynchronous logic or application specific integrated circuitry.

In some embodiments the ATPG testing may occur on chip, off chip or partly on chip and partly off chip.

In some embodiments the handovers between clock domains occur synchronously by the use of flip flops.

In some embodiments both the clock controller 205 and the bypass unit 510 may be used to enable an dynamic sequential clock controller 506 to be pulsed during an ATPG test pattern. Thus the clock controller 205 may generate the shift/capture clock output first and then enable the bypass unit to provide a handshake signal which may be received by the next dynamic sequential clock controller. When a dynamic sequential clock controller is to be bypassed, the clock controller may not generate the clock output due to the value of the chain bits and the bypass unit may be enabled via handshake signal from a previous dynamic sequential clock controller.

In some embodiments, the sequential pulsing of one clock domain at one time during scan capture may be achieved by modifying the number of shift registers employed in every clock controller. By employing additional shift registers in the subsequent clock controllers, the generation of clock output may be delayed. The registers to be added, called dummy registers, may be evaluated with the frequency operation and number of capture cycles of each clock controller. For example, if two clock controllers are working on same frequency but different phase, when the first clock controller, comprises 3 shift registers, instead of using a handshake signal, the shift register length of the second clock controller may be increased to comprise 6 shift registers, three being dummy registers configured to delay the output of the second clock controller.

In some embodiments, the sequential pulsing of one clock domain at one time during scan capture may be achieved by individually controlling the Scan Enable signal of each clock controller separately only during capture. In such embodiments operation of each clock controller and as a result the bubble generation in each clock controller may be controlled individually.

Various modifications to the embodiments described above will readily occur to the skilled person. The invention is not limited to these specific examples.

What is claimed is:

1. A controller, comprising:
an input configured to receive an input sequential selection signal from a previous controller;
a clock bit unit generating clock bit signals specifying clock pulses to generate;
a clock control unit configured to receive the clock bit signals and responsively generate a pulsed output comprising the clock pulses specified by the clock bit signals; and
a bypass unit configured to provide an output sequential selection signal for application to a further controller, wherein the bypass unit generates the output sequential selection signal in response to the received input sequential selection signal.

2. The controller of claim 1 wherein at least one of said clock control unit and said bypass unit is respectively controlled in response to received information comprising scan enable information or clock controller enable information.

3. The controller of claim 1 wherein said bypass unit is configured to receive the input sequential selection signal from at least one of said clock control unit, the previous controller and a control unit.

4. The controller of claim 1 wherein said bypass unit is configured to provide said output sequential selection signal if said bypass unit has received the input sequential selection signal from said clock control unit or the input sequential selection signal indicates that said pulsed output is not required.

5. The controller of claim 1 further comprising a first stability unit configured to receive the input sequential selection signal at an operating frequency of said controller.

6. The controller of claim 5, wherein at least one of said clock control unit and said bypass unit is respectively controlled in response to received information comprising at least one of: scan enable information and clock controller enable information, and wherein said first stability unit comprises a shift register configured to store said input sequential selection signal for a plurality of cycles of an operating frequency of said controller.

7. The controller of claim 5 further comprising a second stability unit configured to receive the scan enable information at said operating frequency of said controller.

8. The controller of claim 7 further comprising a clock gating unit configured to combine the outputs of said first stability unit and said second stability unit at said operating frequency of said controller, said clock gating unit being configured to provide an input to said clock control unit.

9. The controller of claim 1 wherein said pulsed output is a capture clock output applied to at least one logic block.

10. The controller of claim 9 wherein said output sequential selection signal is sequential selection information for said further controller.

11. The controller of claim 1 wherein said output sequential selection signal is provided at an operating frequency of said controller.

12. A chain of N controllers, wherein N is greater than or equal to two, wherein each controller comprises:
an input configured to receive an input sequential selection signal from a previous controller;
a clock bit unit generating clock bit signals specifying clock pulses to generate;
a clock control unit configured to receive the clock bit signals and generate a pulsed output comprising the clock pulses indicated by the clock bit signals; and
a bypass unit configured to provide an output sequential selection signal for application to a further controller after the pulsed output is generated in response to the received input sequential selection signal.

13. The chain of N controllers of claim 12, wherein at least one of said clock control unit and said bypass unit is respectively controlled in response to received information comprising scan enable information and clock controller enable information, and wherein the input sequential selection signal received by the clock control unit of a first of said controllers is said scan enable signal and the received input sequential selection signal received by said further and subsequent controllers is said output sequential selection signal of said bypass unit of a preceding controller.

14. The chain of N controllers of claim 12 wherein when the clock control unit of at least one of said previous and further controllers is not required, said bypass unit of said at least one not required controller receives sequential selection information from another controller.

15. The chain of N controllers of claim 14 wherein said input sequential selection signal is said output sequential selection signal of said bypass unit of said previous controller.

16. A circuit testing unit comprising, a control unit, at least one oscillator, a chain of N controllers, wherein N is greater than or equal to two, wherein each controller comprises:
an input configured to receive an input sequential selection signal from a previous controller, a clock input, and a scan enable signal, the scan enable signal indicating multiple modes of operation;
a control bit unit configured to indicate clock pulses to be generated;
a clock control unit configured to:
generate a pulsed output comprising the clock pulses with pulse widths equal to a frequency of the clock input when the scan enable signal indicates a first mode of operation, and
generate a controller output comprising the clock signal when the scan enable signal indicates a second mode of operation; and
a bypass unit configured to provide an output sequential selection signal to a further controller after generation of the pulsed output, wherein said controller is configured to cause said bypass unit to output said output sequential selection signal and to optionally cause said clock control unit to output said pulsed output, wherein each of said further and subsequent controllers receives, as an input, said output sequential selection signal from said bypass unit of the previous controller.

17. The circuit testing unit as claimed in claim 16 configured to receive at least one automatic test pattern generation sequence.

18. The circuit testing unit as claimed in claim 16, wherein said circuit testing unit is an on chip circuit testing unit.

19. The controller as claimed in claim 1, wherein the clock control unit blocks pulsing of the pulsed output in response to the received input sequential selection signal.

20. The circuit testing unit as claimed in claim 16, further comprising test circuitry associated with each of said N controllers.

* * * * *